(12) United States Patent
Tel et al.

(10) Patent No.: US 9,177,219 B2
(45) Date of Patent: Nov. 3, 2015

(54) METHOD OF CALIBRATING A LITHOGRAPHIC APPARATUS, DEVICE MANUFACTURING METHOD AND ASSOCIATED DATA PROCESSING APPARATUS AND COMPUTER PROGRAM PRODUCT

(75) Inventors: Wim Tjibbo Tel, Helmond (NL); Wouter Onno Pril, Geldrop (NL); Thomas Theeuwes, Veldhoven (NL); Alexander Viktorovych Padiy, Geldrop (NL)

(73) Assignee: ASML Netherlands B.V., Veldhoven (NL)

( * ) Notice: Subject to any disclaimer, the term of this patent is extended or adjusted under 35 U.S.C. 154(b) by 806 days.

(21) Appl. No.: 13/169,673

(22) Filed: Jun. 27, 2011

(65) Prior Publication Data
US 2012/0008127 A1 Jan. 12, 2012

Related U.S. Application Data

(60) Provisional application No. 61/362,901, filed on Jul. 9, 2010.

(51) Int. Cl.
| | | |
|---|---|---|
| *G03B 27/68* | (2006.01) | |
| *G03B 27/32* | (2006.01) | |
| *G06K 9/32* | (2006.01) | |
| *G03F 7/20* | (2006.01) | |
| *G06T 7/00* | (2006.01) | |

(52) U.S. Cl.
CPC .......... *G06K 9/3216* (2013.01); *G03F 7/70516* (2013.01); *G06T 7/0018* (2013.01); *G06T 7/0042* (2013.01); *G06T 2207/10004* (2013.01); *G06T 2207/10061* (2013.01); *G06T 2207/20224* (2013.01); *G06T 2207/30148* (2013.01)

(58) Field of Classification Search
CPC .................. G03F 7/70516; G06T 2207/20224
USPC ...................................... 355/77, 52; 382/151
See application file for complete search history.

(56) References Cited

U.S. PATENT DOCUMENTS

| | | | | |
|---|---|---|---|---|
| 5,877,861 A | * | 3/1999 | Ausschnitt et al. | ........... 356/401 |
| 6,159,644 A | * | 12/2000 | Satoh et al. | ...................... 430/22 |
| 6,460,002 B1 | * | 10/2002 | Bone et al. | ....................... 702/81 |
| 6,684,122 B1 | * | 1/2004 | Christian et al. | .............. 700/121 |
| 6,815,232 B2 | * | 11/2004 | Jones et al. | ..................... 438/14 |

(Continued)

*Primary Examiner* — Deoram Persaud
(74) *Attorney, Agent, or Firm* — Sterne, Kessler, Goldstein & Fox P.L.L.C.

(57) ABSTRACT

A lithographic apparatus is calibrated by reference to a primary reference substrate. Using an apparatus which need not be the same as the one being calibrated, there is obtained an apparatus-specific fingerprint of the primary reference substrate. Using the same set-up there is then obtained an apparatus-specific fingerprint of a secondary reference substrate. The apparatus-specific fingerprint of the primary reference substrate is subtracted from the apparatus-specific fingerprint of the secondary reference substrate to obtain and store an apparatus-independent fingerprint of the secondary reference substrate. The secondary reference substrate and stored apparatus-independent fingerprint are subsequently used together in place of the primary reference substrate as a reference for the calibration of the lithographic apparatus to be calibrated. Initial set-up for a cluster of lithographic tools can be performed with less use of the costly primary reference substrate, and with less interruption to normal production. The initial set-up can be integrated with on-going monitoring and re-calibration of the apparatuses.

16 Claims, 5 Drawing Sheets

(56) References Cited

U.S. PATENT DOCUMENTS

| | | | |
|---|---|---|---|
| 6,912,436 B1* | 6/2005 | Jones et al. | 700/121 |
| 6,957,119 B2 | 10/2005 | Peng et al. | |
| 7,181,354 B1* | 2/2007 | Bone et al. | 702/84 |
| 7,349,753 B2* | 3/2008 | Paik | 700/110 |
| 7,468,795 B2* | 12/2008 | Simons et al. | 356/401 |
| 7,542,880 B2* | 6/2009 | Good et al. | 702/194 |
| 7,580,767 B2* | 8/2009 | MacDonald et al. | 700/108 |
| 8,288,063 B2* | 10/2012 | Lu et al. | 430/22 |
| 8,605,248 B2* | 12/2013 | Kawakubo | 355/52 |
| 2003/0223630 A1* | 12/2003 | Adel et al. | 382/145 |
| 2004/0015256 A1* | 1/2004 | Conrad et al. | 700/121 |
| 2007/0052940 A1* | 3/2007 | Zaal et al. | 355/53 |
| 2008/0018874 A1* | 1/2008 | Dusa et al. | 355/55 |
| 2011/0096339 A1* | 4/2011 | Naot | 356/630 |
| 2011/0216293 A1* | 9/2011 | Padiy et al. | 355/52 |
| 2011/0216294 A1* | 9/2011 | Menchtchikov et al. | 355/53 |

* cited by examiner

METHOD OF CALIBRATING A LITHOGRAPHIC APPARATUS, DEVICE MANUFACTURING METHOD AND ASSOCIATED DATA PROCESSING APPARATUS AND COMPUTER PROGRAM PRODUCT

CROSS REFERENCE TO RELATED APPLICATIONS

This application claims benefit under 35 U.S.C. 119(e) to U.S. Provisional Application No. 61/362,901, filed Jul. 9, 2010, which is incorporated by reference herein in its entirety.

BACKGROUND OF THE INVENTION

1. Field of the Invention

The present invention relates to a method for calibrating a lithographic apparatus. The present invention further relates to methods of manufacturing devices using lithographic apparatus calibrated by such a method, and to data processing apparatuses and computer program products for implementing parts of such a method.

2. Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction.

In order to monitor the lithographic process, it is necessary to measure parameters of the patterned substrate, for example the overlay error between successive layers formed in or on it and critical line width in a developed metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

In order to better control scanner functionality, a module has been recently devised which automatically drives the system towards a pre-defined baseline each day. This scanner stability module retrieves standard measurements taken from a stability monitor wafer using a metrology tool. The monitor wafer had been previously exposed using a special reticle containing special scatterometry marks (or marks suitable for whatever other metrology tool is to be used). Using the monitor wafer and that day's measurements (and possibly the historical measurement data from the previous days), the scanner stability module determines how far the system has drifted from its baseline, and then calculates wafer-level overlay and focus correction sets. The baseline can be defined either directly by the reference layer on the monitor wafers (in this case the scanner stability module will drive the system towards minimal overlay on the monitor wafers) or indirectly by a combination of the reference layer on the wafers and the target overlay fingerprint (in this case the scanner stability module will drive the system towards defined target overlay fingerprint on the stability monitor wafers). The lithography system then converts these correction sets into specific corrections for each exposure on subsequent production wafers.

While the scanner stability module using monitor wafers attends to stability of performance of a lithography tool, and may be performed daily, there remains the separate need to perform initial calibration of the tool when it is installed, and after any major interruption in operation. This calibration is done by conventional processes using specially manufactured reference wafers. After an interruption in operation, the calibration to reference wafers is performed again, after which the scanner stability module is reset by exposing and monitoring a stability monitor wafer. Given that any interruption of production using these expensive tools is very costly, users currently have to weigh up the benefits of the stability module against the cost of this extra calibration step. Another loss in productivity arises when the monitor wafer wears out and a new monitor wafer must be made with high accuracy. Further, there is the overhead and risk attached to the need for monitor wafers to be made and maintained with specific tools, in a facility where several tools may be operating side-by-side.

SUMMARY

Embodiments of the present invention aim to enable improved calibration of lithographic apparatus of the type described above, for example to reduce the throughput penalties of calibration procedures and/or stability monitoring, and/or to reduce the cost of calibration materials used in such procedures. Some embodiments of the present invention integrate a stability monitoring process and a calibration process in such a manner that productivity is less disrupted.

In a first aspect, the present invention provides a method of calibrating a lithographic apparatus, the lithographic apparatus comprising a support for a substrate a patterning subsystem for applying a pattern to the substrate, a measurement subsystem for measuring features on the substrate and a positioning subsystem for controlling the support and the patterning subsystem so as to apply the pattern at a desired position on the substrate, the accuracy of applying the pattern being dependent upon the use of calibration data for correcting apparatus-specific deviations in the performance of the apparatus across the substrate. In the novel method, one or more secondary reference substrates with respective and stored apparatus-independent fingerprints are used together in place of a primary reference substrate or substrates, for the calibration of the lithographic apparatus.

Various methods are available for obtaining and storing the apparatus-independent fingerprint of the secondary reference substrate relative to the primary reference substrate, and for preparing numbers of secondary reference substrates. In one embodiment, the method comprises using a measuring process to obtain an apparatus-specific fingerprint of the primary reference substrate, the apparatus-specific fingerprint depending on the performance of one or more apparatuses used in the measurement process, using a measuring process to obtain an apparatus-specific fingerprint of the secondary reference substrate, and subtracting the apparatus-specific fingerprint of the primary reference substrate from the apparatus-specific fingerprint of the secondary reference substrate to obtain and store an apparatus-independent fingerprint of the secondary reference substrate.

The measuring processes can be performed using metrology functions of the lithographic apparatus itself, and/or separate metrology apparatus. The lithography apparatus used for this need not be the one that is to be calibrated in due course. The measuring process may be performed directly by measuring reference features present on the reference substrates, or it may include applying patterns onto the reference substrates by reference to the reference features Other embodiments of the present invention further provides a device manufacturing method wherein a lithographic apparatus is calibrated by a method as set forth above.

Other embodiments of the present invention further provides data processing apparatus and a computer program products useful in implementing the present invention of the above embodiments.

These and other features and advantages of the present invention will be understood by the skilled reader from a consideration of the exemplary embodiments discussed below.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1:
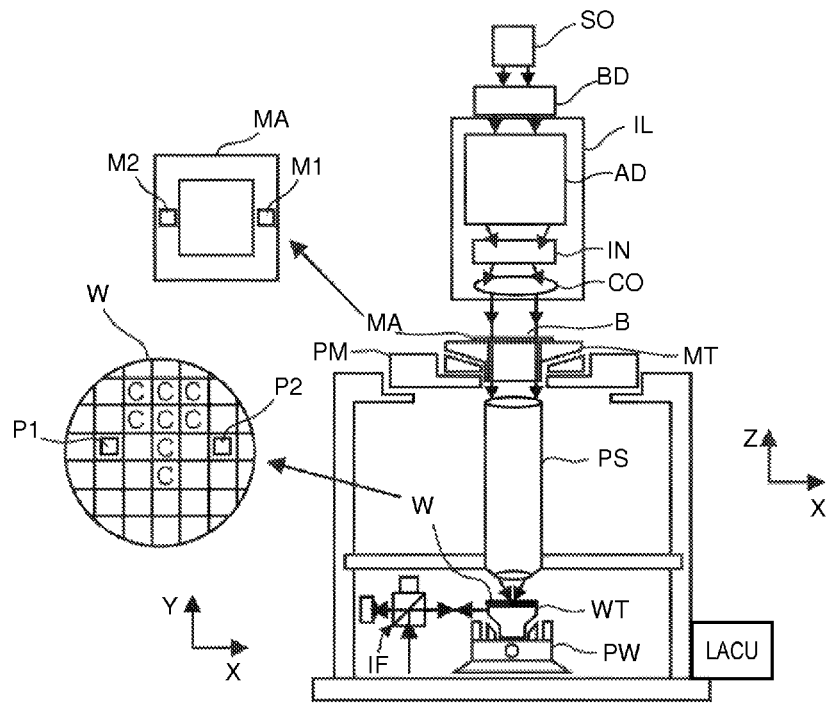
FIG. 1 depicts a lithographic apparatus, according to an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts a lithographic apparatus according to one embodiment of the present invention. The apparatus comprises an illumination system (illuminator) IL configured to condition a radiation beam B (e.g., UV radiation or EUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist-coated wafer) W and connected to a second positioner PW configured to accurately position the substrate in accordance with certain parameters, and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The apparatus further includes a lithography control unit LACU which controls all the movements and measurements of the various actuators and sensors described.

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The present invention disclosed herein provides additional flexibility in both single- and multi-stage apparatuses.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2.

Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to readout of the position sensor IF. Overall control of the apparatus may be controlled by a central processing unit, communicating with these sub-systems processing units, with operators and with other apparatuses involved in the lithographic manufacturing process.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed. The correction mechanism addressed in this patent application are particularly associated with exposures performed with scanning movements, as in mode 2 and 3 mentioned above.

Figure 2:
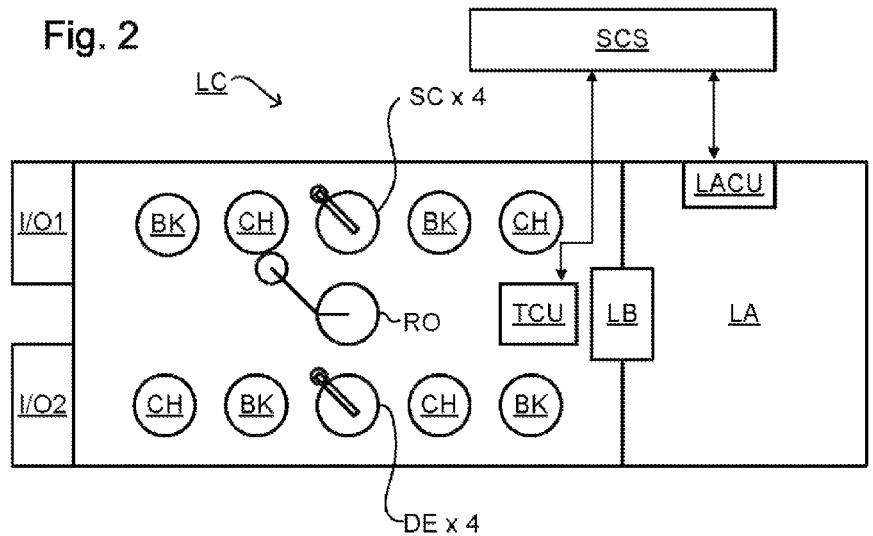
FIG. 2 depicts a lithographic cell or cluster including the apparatus of FIG. 1.

As shown in FIG. 2, the lithographic apparatus LA forms part of a lithographic cell LC, also sometimes referred to a 'lithocell' or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded, thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

A key component of accurate lithography is an ability to calibrate individual lithographic apparatus. In addition to general parameters affecting the whole substrate area, it is known to map and model the error 'fingerprint' of an individual apparatus across the substrate area. This fingerprint, which can be established in terms of focus, dose and/or alignment, can be used during exposure to correct the idiosyncrasies of that apparatus, and thereby achieve a more accurate patterning.

Improvements to the apparatus's focus and overlay (layer-to-layer alignment) uniformity have recently been achieved by the applicant's Baseliner™ scanner stability module, leading to an optimized process window for a given feature size and chip application, enabling the continuation the creation of smaller, more advanced chips. The scanner stability module in a preferred embodiment automatically resets the system to a pre-defined baseline each day. To do this it retrieves standard measurements taken from a monitor wafer using a metrology tool. The monitor wafer is exposed using a special reticle containing special scatterometry marks. From that day's measurements, the scanner stability module determines how far the system has drifted from its baseline. It then calculates wafer-level overlay and focus correction sets. The lithography system then converts these correction sets into specific corrections for each exposure on subsequent production wafers.

Figure 3:
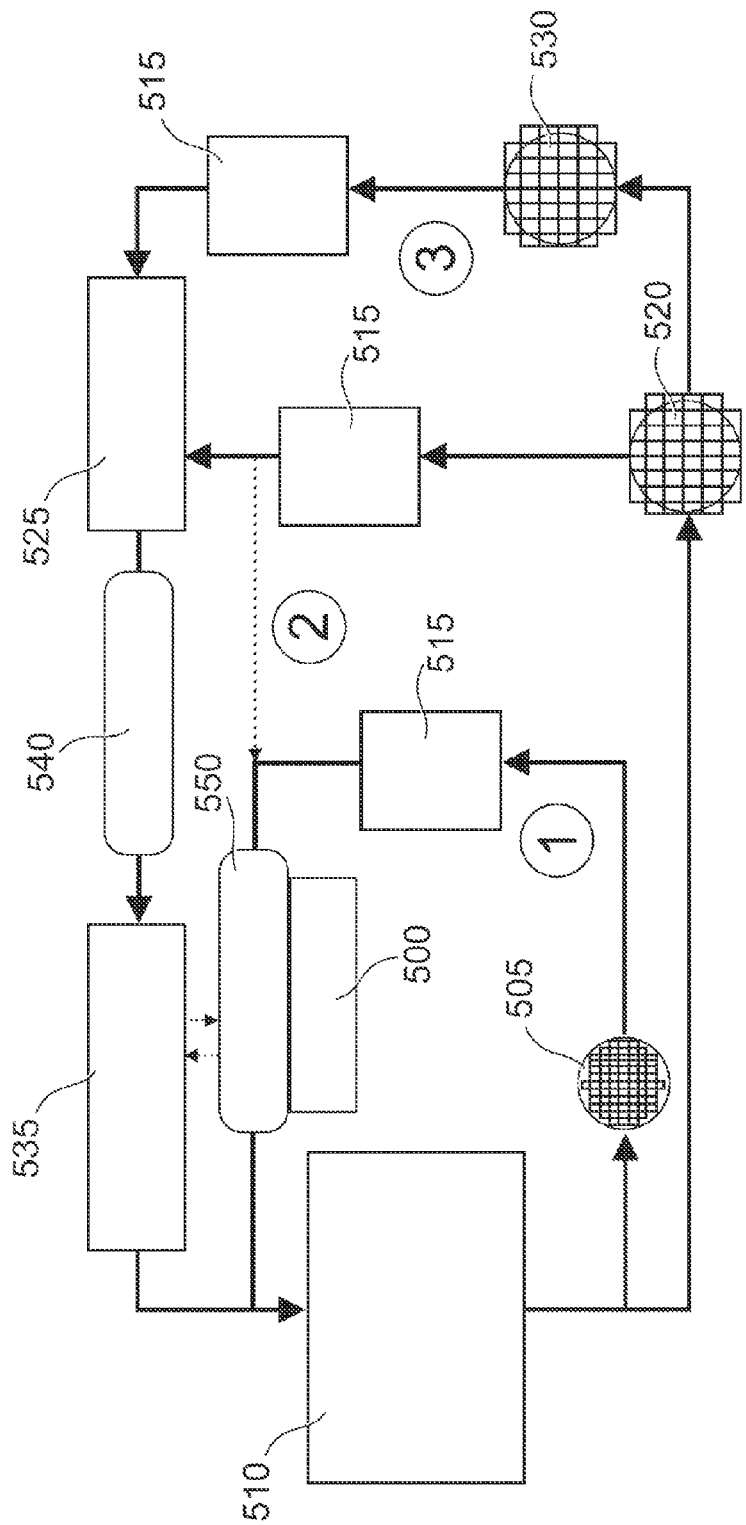
FIG. 3 is a schematic diagram of control mechanisms in a lithographic process utilizing a scanner stability module.

FIG. 3 depicts the overall lithography and metrology method incorporating the scanner stability module 500 (essentially an application running on a server, in this example). Shown are three main process control loops, labeled 1, 2, 3. The first loop provides the local scanner control using the scanner stability module 500 and monitor wafers. The monitor wafer 505 is shown being passed from the main lithography unit 510, having been exposed to set the baseline parameters for focus and overlay. At a later time, metrology unit 515 reads these baseline parameters, which are then interpreted by the scanner stability module 500 so as to calculate correction routines so as to provide scanner feedback 550, which is passed to the main lithography unit 510, and used when performing further exposures.

The second (APC) loop is for local scanner control on-product (determining focus, dose, and overlay). The exposed product wafer 520 is passed to metrology unit 515 where information relating to the critical dimensions, sidewall angles and overlay is determined and passed onto the Advanced Process Control (APC) module 525. This data is also passed to the scanner stability module 500. Process corrections 540 are made before the Manufacturing Execution System (MES) 535 takes over, providing scanner control to the main lithography unit 510, in communication with the scanner stability module 500.

The third loop is to allow metrology integration into the second (APC) loop (e.g., for double patterning). The post etched wafer 530 is passed to metrology unit 515 which again passes information relating to the critical dimensions, sidewall angles and overlay, read from the wafer, to the Advanced Process Control (APC) module 525. The loop continues the same as with the second loop.

Calibration and Stability Control—Existing Method

Figure 4:
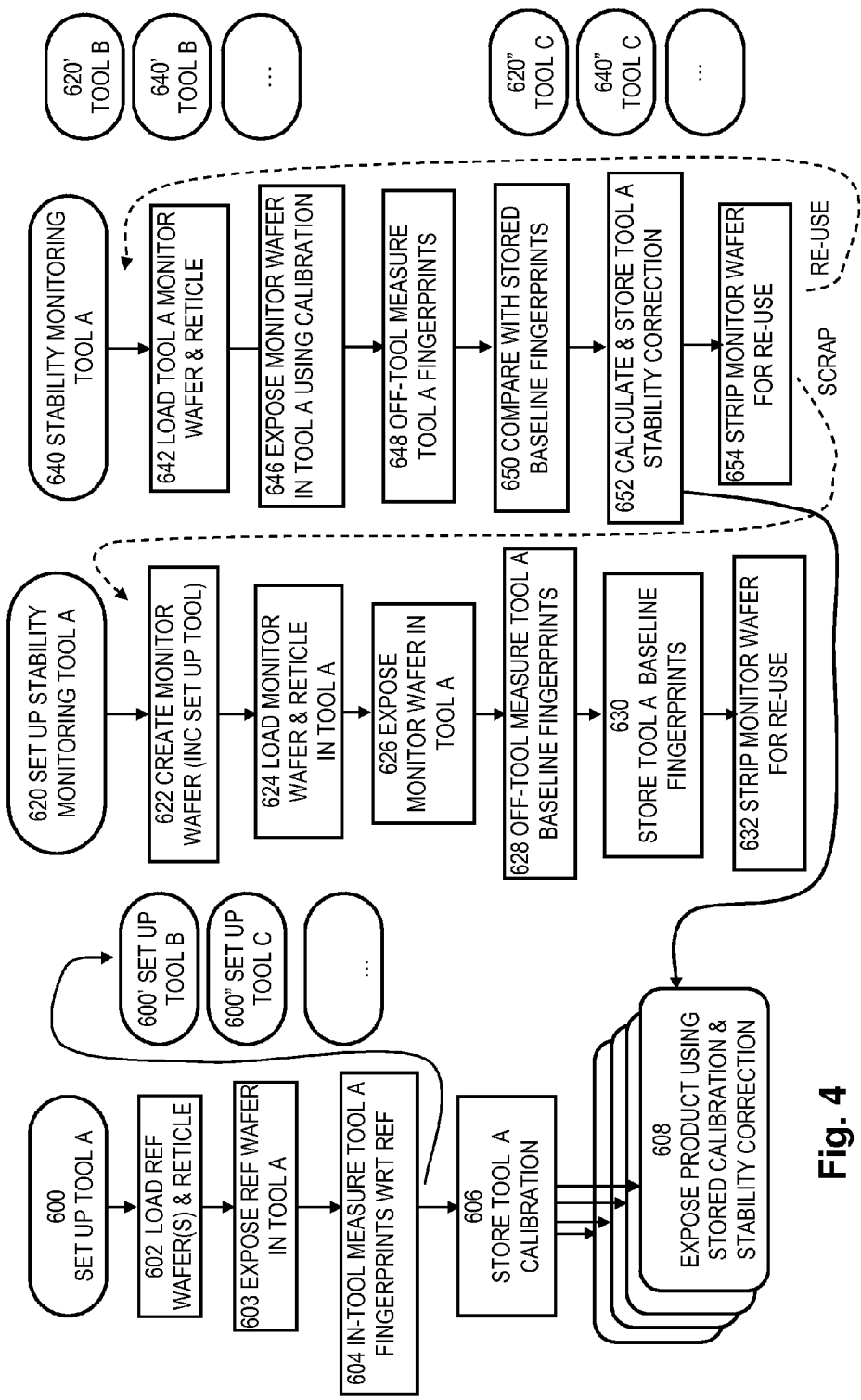
FIG. 4 illustrates a known set of calibration and stability monitoring processes using the scanner stability module of FIG. 3.

FIG. 4 illustrates in flow chart form the calibration and stability monitoring procedures, as presently implemented. By way of background, it is envisaged that several lithography apparatus (referred to hereafter as tools) may be present at a manufacturing facility. These can be referred as tools A, B, C, etc.

Three processes are described, labeled 600, 620 and 640, which are involved in the calibration and stability monitoring. The skilled reader will appreciate that these processes are described at a relatively high level only, and many details are omitted for the sake of brevity. Each machine is assumed, purely for the sake of example, to be a scanner type lithographic apparatus, and it may be of the type which has two wafer tables (chucks), used in alternation. For maximum performance in focus and overlay, calibration and monitoring is performed with attention to the difference between scan-up and scan-down exposures, as well as chuck-to-chuck variations. These details will be omitted from the description. The description will concentrate on overlay as the performance parameter of interest. The methods are applicable to other parameters, such as focus, and overlay is mentioned as an example only.

Process 600 relates to the initial set up of a lithography apparatus, for example, tool A. At 602 a special reference wafer is loaded which has, for example, a very accurate square grid of alignment marks etched upon it. A layer of resist has been coated on top of the etched marks and at 603 this is exposed by the tool being calibrated, using an appropriate reference reticle. In practice, a number of such reference wafers will be loaded and measured, and results combined statistically to attain the very maximum accuracy possible. For the simplicity of the present description, we will refer only to single measurements, while the skilled reader can readily add the implementational details appropriate to the circumstances.

At 604, metrology sensors within the tool are used to measure various points across the reference wafer, and to determine a "fingerprint" of the tool itself, compared with the reference grid on the reference wafer. "Fingerprint" in this context is understood as the pattern of deviations across the wafer surface, by which a measurement delivered by the tool's own instrumentation and actuation differs from the actual position of a feature of the substrate. In addition to a wafer-wide (interfield) fingerprint, a so-called intrafield fingerprint can also be measured, representing the deviations within each field that are repeated at each field location (substrate portion) across the wafer.

At 606, the measured fingerprints are stored as interfield and intrafield calibration data for tool A. As mentioned already, separate data can be stored for scan-up and scan-down directions (particularly in the intrafield fingerprint). Data specific to individual wafer tables (chucks) can be stored either in absolute terms or by deviations from a nominal fingerprint.

At 608, the normal operation of a tool begins, exposing product wafers. The stored calibration data is used to ensure that positions measured using the tool's instrumentation are corrected to subtract the appropriate fingerprints, allowing the tool to place features on the wafer as close as possible to the desired absolute positions on the wafer.

Similar set up operations are performed at 600' and 600" for other tools B, C, etc. An important consideration in the efficient running of the manufacturing facility is that product wafers should be able to be processed on any of the tools of a given type that may be available. The calibration process, using a common set of reference wafers and matching reticles, are an important part of ensuring that tools A, B, C, etc. are not only consistent in their own performance, but are matched to one another, so that different product layers on a product wafer can be formed using different tools, without significant overlay error.

As mentioned in box 608 of FIG. 4, in this example, product wafers are exposed using not only the calibration data from the reference wafer set up process 600, but also using corrections from a stability monitoring process, which will now be described. The function of the stability monitoring processes is to maintain as far as possible the performance of each tool A, B, C at the level established in the set up process 600. The set up process 600 is extremely time-consuming and the reference wafers are delicate and expensive. It is therefore not a process that should be repeated regularly. The stability monitoring process, on the other hand, is designed to operate with minimal interruption to normal operations, and can be repeated, say, once a day.

Process 620 relates to the initialization of the stability monitoring process, which corresponds to the first feedback loop in FIG. 3. The stability monitoring is based on the use of monitor wafers, which have a special pattern of etched features against which overlay of in-resist features can be measured. At step 622, a monitor wafer is created using a special monitoring wafer reticle and an exposure and etching process, which are not described in detail. It is sufficient to note that the accuracy of the subsequent process depends on the tool being set up with high accuracy, before the manufacture of the monitor wafer. As in the case of the reference wafers, a set of monitor wafers may in fact be generated, and results of using plural wafers may be combined statistically to improve accuracy. The following description mentions only a single wafer, for simplicity.

At step 624, the monitor wafer having etched features is loaded in the tool, with a layer of radiation-sensitive resist material coated on top of the etched features. A monitor reticle is also loaded in the tool.

At 626, the monitor wafer is exposed using the monitor reticle to create an in-resist pattern on top of the etched features. At 628, the metrology unit 515 is used to measure the exposed monitor wafer and identify a "baseline" fingerprint. As before, the fingerprint is measured separately for scan-up and scan-down directions, and should be measured separately for each chuck if the tool has more than one chuck. At 630, the baseline fingerprints are stored for future reference. At 632, the resist layer from the monitor wafer is stripped, so that it may be re-used for the daily stability monitoring process 640, described below.

The baseline fingerprint generated by process 620 records the performance of the machine at a particular instant in time. If this point in time is immediately after the initial set up process 600, and assuming that the machine is not highly unstable in its performance, then the baseline fingerprint should correspond to the ideal tool set up as defined by the reference wafer. Although the monitor reticle and wafer are cheaper items, not manufactured to the same accuracy as the reference wafer, the fact that the tool was in a known accurate condition when the exposure was made allows the baseline fingerprints to be used as a basis for adjusting the tool to the same accurate condition at future times.

Process 640 is then executed at intervals, to generate corrections which allow the machine to recover this baseline performance at any time. The monitor wafer and reticle used in step 624 are loaded at step 642. At 646 the monitor wafer is exposed, using the calibration stored in step 606. At 648, the exposed wafer is measured in metrology unit 515 to measure a new set of fingerprints for the tool. At 650 the measured fingerprints are compared with the baseline fingerprints. Any deviations are used at 652 as the basis to generate stability correction data which is fed back quickly into the control of production exposures at 608. At 654, the resist is stripped from the monitor wafer, ready for re-use.

Whereas the complete set-up process 600 may take hours of time, during which the tool is unproductive, the stability monitoring process occupies the tool only for a minute or two, while the monitor wafer is loaded and exposed. The impact on production of performing stability corrections every day is therefore minimal. The wafer is re-used a set number of times (e.g., 10-20 times), or until it is found to be damaged. Consequently, there is a reasonably regular need to create new monitor wafers. According to existing techniques, this requires a repeat of step 622, which in turn implies a repeat of the onerous set-up process 600. Consequently, although stability monitoring and correction is greatly facilitated, the existing processes do not eliminate the need for use of the reference wafers and the concomitant loss of productivity.

As noted in the right hand side in the diagram, similar processes 620'/620" and 64'/640" can be applied to measure baseline performance and provide stability corrections for tools B, C, etc., using the monitor wafers that were made on the 'holy' tool A. In the course of stability monitoring, it is important to maintain each monitoring wafer or set of monitoring wafers dedicated to their respective tool. When any of these monitor wafers needs to be replaced, step 622 including process 620 must be performed, interrupting production on the chosen reference machine.

Calibration and Stability Control—First Embodiment of New Method

Figure 5:
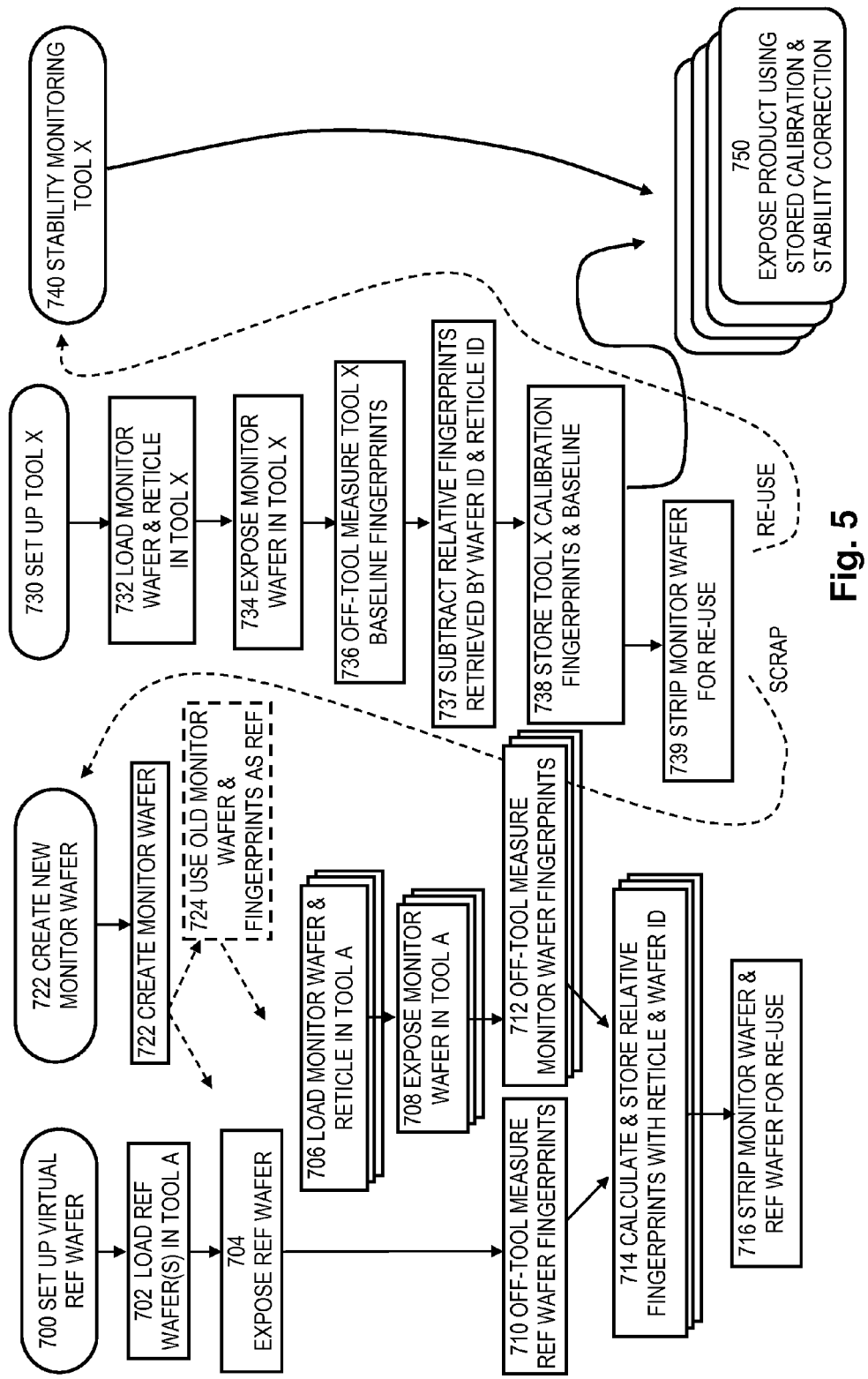
FIG. 5 illustrates a new set of calibration and stability monitoring processes using the scanner stability module adapted and operated, in accordance with an embodiment of the present invention.

FIG. 5 illustrates one example of a new method in which calibration and stability control processes of the type described above are integrated in such a manner that interruptions to production can be reduced greatly, and in which matching of machines can be performed in fewer steps and with fewer logistical restrictions than by the methods of FIG. 4. The new method can be implemented using the same apparatuses as described already with reference to FIGS. 1 to 3, simply by modification of control software and data structures in the control unit LACU. Other embodiments of the new method, with respective advantages and disadvantages, will be described in a separate section, below.

Process 700 replaces the machine set-up process 600 for routine operation of the tools (setup processes of the conventional kind will of course be required in the course of installation and major maintenance). A tool is selected, for example tool A, which has only to be in reasonably stable condition; not perfectly set up. The reference wafer and reticle are loaded in the tool A at 702 and exposed at 704. Unlike process 600, the reference wafer is not measured within the tool, but is swapped for a monitor wafer and reticle at 706. The reference wafer and monitor wafer can be of the known types, though the method is adaptable to different forms. At 708 the monitor wafer is exposed in the same tool as the reference wafer. The interval between exposure steps 704 and 708 is minimized so that the exposure parameters can be assumed identical for both. The exposed wafers are transferred to the metrology unit 515, so that normal production using tool A can resume.

At 710 and 712 metrology unit 515 measures interfield and intrafield overlay variations on the reference wafer and the monitor wafer respectively. At 714 these variations are effectively subtracted one from the other and fingerprints of the monitor wafer and monitor reticle are calculated, which are relative to the reference wafer. These relative fingerprints are stored carefully in association with ID information for the reticle and the monitor wafer, so that they may be recalled later. The monitor wafer and reference wafer are stripped at 716 for subsequent use. The reference wafer can be returned to safe storage, as it will be required very infrequently from now on.

Note at this point that in this embodiment the metrology on the reference wafer has not been performed on the exposure tool A itself. Consequently, the calibration value of the reference wafer according to conventional processes has been lost. Instead, however, there has been produced a reference wafer and a monitor wafer that have been exposed under (assumed) identical conditions on the tool, and that have been measured and compared on the identical metrology unit. Therefore, although the pattern on each wafer is distorted by deviations in both the lithographic tool and the metrology unit, which cannot be known, the relative fingerprints calculated at 714 capture perfectly the deviations of one specific monitor wafer and reticle, relative to the special reference wafer. That is to say, while the individual fingerprints are apparatus-specific, the relative fingerprints are apparatus-independent. By adapting the LACU software to include these relative fingerprints as corrections in all subsequent measurements and calibrations, the low-cost monitor wafer can be used effectively as a high-quality reference wafer through the normal stability monitoring process. Any number of monitor wafers and reticles can be measured against the reference wafer. Provided relative fingerprints are correctly measured and associated with their respective reticle and/or wafer, any number of individual monitor wafers can be used as high-quality references for calibration and stability control of a number of tools.

To illustrate, process 730 now replaces processes 600 and 620 for the setting up of a tool (say 'tool X'). At 732, an identified monitor wafer and reticle, previously processed by process 700, are loaded into the tool. At 734 the monitor wafer is exposed in the tool X and transferred to metrology unit 515. At 736, the metrology unit measures baseline fingerprints in a manner similar to step 648 in the known process. At this point, however, the machine has not been set to a desired condition, so these baseline fingerprints are arbitrary and of little use in themselves. At step 737, however, the relative fingerprints from step 714 which correspond to the particular wafer and reticle being used are retrieved and subtracted from the corresponding fingerprints measured at step 736. The result of this subtraction now represents the 'true' fingerprint of tool X relative to the reference wafer, and can be used at 738 to store calibration data for tool X. These data are used for exposure of product wafers in production process 750. The calibration can also serve as the baseline for stability monitoring, without separately storing a stability monitoring fingerprint (in other words, the baseline fingerprint becomes simply zero).

At 739 the monitor wafer is stripped for future use in the daily stability monitoring process represented briefly at 740. This is the same as the process 640, in which only changes from the baseline fingerprints are measured, and suitable corrections fed into the production process 750 (feedback loop 1 in FIG. 3).

As noted above, in this embodiment the monitor wafer and reference wafer are compared on a common metrology unit and exposed on a common tool. The tool does not need to be specially set up, in order for the relative fingerprints to accurately represent the relationship between the monitor wafer and the reference wafer. Consequently, when a monitor wafer becomes worn out or damaged, the process 722 to create a new one is less disruptive than the existing process 622.

Calibration and Stability Control—Alternative Embodiments

Although it is an advantage that measurements previously performed on the lithographic tool itself can now be performed by a metrology unit off the tool, the present invention is not limited to performing the measurements on a different metrology unit. Metrology systems of the tool itself can be used, if the throughput penalty is not the highest priority. As an example of this, in a first modified embodiment, the step 710 to measure the reference wafer fingerprints is performed on the same lithography tool as the exposure, while step 712 to measure the monitor wafer fingerprints is performed on the separate metrology unit. Because what is measured is the fingerprint of deviations between an underlying reference pattern and an overlying test pattern, the fingerprint measurements are not so machine-specific as measurements of absolute position. Therefore it can still be valid to perform the subtraction at step 714 to obtain a relative fingerprint. Clearly there is a throughput penalty while the lithography tool measures the fingerprint in step 710. However, the penalty is not so bad as when the monitor wafer fingerprint step 712 was also done on the lithographic tool, because normally step 712 is repeated many times to make a new batch of monitor wafers. Moreover, there are potential benefits to using the metrology functions of the tool itself.

Allowing step 710 to be performed on the tool maintains compatibility with existing primary reference wafers and measurement techniques, which may not be possible or well-tested on the separate metrology unit. At the same time, the metrology unit and the monitor wafer patterns can be optimized for rapid measurement, for example by scatterometry and reconstruction, rather than being constrained to use the same patterns and measurement techniques that have been established for the primary reference wafers.

Additionally, any measurement technique tends to suffer from a degree of process sensitivity, whereby measurements of, say, the position of a feature are influenced by variations in parameters other than position, such as side wall angle, asymmetry, resist height. Where the off-tool metrology unit, for example a scatterometer, uses a different measuring principle from the on-tool metrology sensors, the process dependencies in the off-tool and on-tool measurements made will not be the same. Therefore, the modified embodiment in which measurements for making new reference wafers are performed using the on-tool sensors has the benefit that process dependencies of the on-tool metrology sensors, that will be used in the actual production, will be properly incorporated in the calibration. The process dependencies will not vary much between tools, so long as the on-tool metrology sensors are of the same type, so that the modified method still allows greater flexibility in the choice of tools used for the set up and creation of new reference wafers.

In yet another modified embodiment, all measurements in steps 710 and 712 can be performed on the lithographic tool itself. Because they are being measured on the same machine, the apparatus-specific fingerprints for the reference wafer and the monitor wafer can be measured directly, without applying overlying patterns in steps 704 and 708. The coating with resist and the stripping steps can be eliminated, reducing wear and tear on the expensive reference wafer as well as the monitor wafer.

Hybrid techniques combining features of the above embodiments are also possible. For example, the same measurements can be made in two different ways, simply to cross-check and/or improve accuracy by statistical combination of results. For another example, interfield fingerprints and intrafield measurements can be performed in different ways. In one particular embodiment, interfield fingerprints are measured using the direct method described in the previous paragraph, while intrafield fingerprints are measured using exposure steps 704 & 708, as illustrated in FIG. 5.

In choosing the which method to use, the skilled reader can balance throughput penalties (lost production time) against the potential benefits. Nevertheless, the result is again a set of monitor wafers and/or reticles that are calibrated with fingerprints relative to a primary reference wafer and reticle, so that they can be used as substitutes for the reference wafer in calibrating a number of lithographic tools.

Conclusion

As will be appreciated from the above, it is proposed herein to calibrate lithography apparatus such as scanners indirectly, through the medium of monitor wafers whose fingerprints are known relative to an absolute reference wafer. The intermediate step of calibrating the apparatus to the reference wafer can be eliminated. In one embodiment, the following benefits are available, according to choice, when using the new calibration and monitoring procedures offered:

1. When a tool operator matches to reference wafers, the introduction of stability monitoring needn't have any impact on work in progress (WIP).
2. The new matching procedure reduces the tool periodic maintenance and incident recovery times.
3. When monitor wafers need to be replaced (wear), a fast and flexible procedure is available to determine the fingerprint of the new wafers:
   a. the setup status of the tool on which the new wafers are compared with the reference wafers doesn't need to be perfect, which saves calibration time. Moreover, no dedicated ('holy') tool needs to be maintained for monitor wafer replacements.

b. When the tool of choice used to determine the fingerprint of the new wafers was well controlled by stability monitoring, no additional reference wafer readouts are needed. Scheduled down time of this tool will be minimized.

4. There is no need to dedicate a particular monitor wafer or set of monitor wafers to a particular tool or chuck.

5. There is no need to dedicate a particular monitor wafer reticle to a particular tool.

Other embodiments offer different subsets of the above benefits and benefits of their own, as already explained above.

Lithography Apparatus Control Unit LACU

Figure 6:
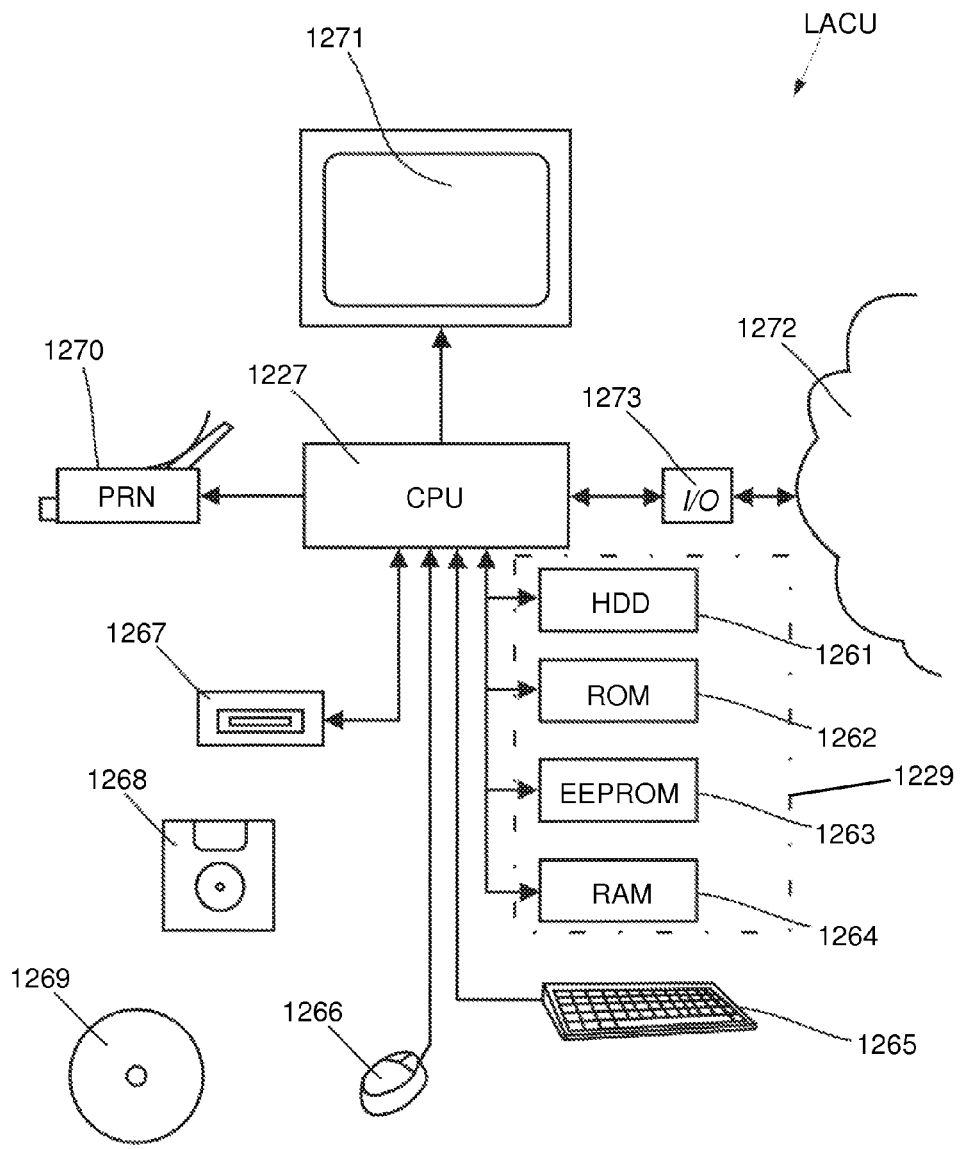
FIG. 6 is a view of a lithographic apparatus control unit controlling the apparatus and method, according to the present invention.

It should be understood that the lithography control unit LACU in the previous embodiments may be based on a computer assembly as shown in FIG. 6. The computer assembly may be a dedicated computer in the form of a control unit in embodiments of the assembly according to the present invention or, alternatively, be a central computer controlling the lithographic apparatus. The computer assembly may be arranged for loading a computer program product comprising computer executable code. This may enable the computer assembly, when the computer program product is downloaded, to implement the novel operations of the lithographic apparatus including the metrology unit, in accordance with the methods described above.

Memory 1229 connected to processor 1227 may comprise a number of memory components like a hard disk 1231, Read Only Memory (ROM) 1262, Electrically Erasable Programmable Read Only Memory (EEPROM) 1263 and Random Access Memory (RAM) 1264. Not all aforementioned memory components need to be present. Furthermore, it is not essential that aforementioned memory components are physically in close proximity to the processor 1227 or to each other. They may be located at a distance away The processor 1227 may also be connected to some kind of user interface, for instance a keyboard 1265 or a mouse 1266. A touch screen, track ball, speech converter or other interfaces that are known to persons skilled in the art may also be used.

The processor 1227 may be connected to a reading unit 1267, which is arranged to read data, e.g., in the form of computer executable code, from and under some circumstances store data on a data carrier, like a removable disc 1268 or a CDROM 1269. Also DVD's or other data carriers known to persons skilled in the art may be used.

The processor 1227 may also be connected to a printer 1270 to print out output data on paper as well as to a display 1271, for instance a monitor or LCD (Liquid Crystal Display), of any other type of display known to a person skilled in the art.

The processor 1227 may be connected to a communications network 1272, for instance a public switched telephone network (PSTN), a local area network (LAN), a wide area network (WAN) etc. by means of transmitters/receivers 1273 responsible for input/output (I/O). The processor 1227 may be arranged to communicate with other communication systems via the communications network 1272. In an embodiment of the present invention external computers (not shown), for instance personal computers of operators, can log into the processor 1227 via the communications network 1272.

The processor 1227 may be implemented as an independent system or as a number of processing units that operate in parallel, wherein each processing unit is arranged to execute sub-tasks of a larger program. The processing units may also be divided in one or more main processing units with several sub-processing units. Some processing units of the processor 1227 may even be located a distance away of the other processing units and communicate via communications network 1272. Separate processing units external to the lithographic apparatus may be used, for example, for implementing the scanner stability module 500, Advanced Process Control (APC) module 525 and Manufacturing Execution System (MES). These processing units can have the same general architecture as the one illustrated here.

It is observed that, although all connections in the drawing are shown as physical connections, one or more of these connections can be made wireless. They are only intended to show that "connected" units are arranged to communicate with one another in some way. The computer system can be any signal processing system with analogue and/or digital and/or software technology arranged to perform the functions discussed here.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the present invention have been described above, it will be appreciated that the present invention may be practiced otherwise than as described. For example, the present invention may take the form of a computer program containing one or more sequences of machine-readable instructions describing a method as disclosed above, or a data storage medium (e.g., semiconductor memory, magnetic or optical disk) having such a computer program stored therein. Separate program products may be provided, for example, for controlling the injection of probe frequencies and for presenting and analyzing the measurement results.

The descriptions above are intended to be illustrative, not limiting. Thus, it will be apparent to one skilled in the art that modifications may be made to the present invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The claims in the instant application are different than those of the parent application or other related applications. The Applicant therefore rescinds any disclaimer of claim scope made in the parent application or any predecessor application in relation to the instant application. The Examiner is therefore advised that any such previous disclaimer and the cited references that it was made to avoid, may need to be revisited. Further, the Examiner is also reminded that any disclaimer made in the instant application should not be read into or against the parent application.

What is claimed is:

1. A method of calibrating a lithographic apparatus, the lithographic apparatus, comprising a support for a substrate a patterning subsystem for applying a pattern to the substrate, a measurement subsystem for measuring features on the substrate and a positioning subsystem for controlling the support and the patterning subsystem so as to apply the pattern at a desired position on the substrate, the accuracy of applying the pattern being dependent upon use of calibration data for correcting apparatus-specific deviations in the performance of the lithographic apparatus across the substrate, the method comprising:
   (a) providing a primary reference substrate having primary reference features positioned thereon, the positioning of the primary reference features being adopted as an accurate reference for calibration of the lithographic apparatus;
   (b) providing a secondary reference substrate having secondary reference features positioned thereon;
   (c) obtaining and storing an apparatus-independent fingerprint of the secondary reference substrate relative to the primary reference substrate;
   (d) calibrating the lithographic apparatus using the secondary reference substrate and the stored apparatus-independent fingerprint together as a reference; and
   (e) using the secondary reference substrate and the stored apparatus-independent fingerprint together as the reference to perform subsequent calibrations of the lithographic apparatus.

2. The method of claim 1 wherein step (c) comprises:
   (c1) using a measuring process to obtain an apparatus-specific fingerprint of the primary reference substrate, the apparatus-specific fingerprint depending on the performance of one or more apparatuses used in the measurement process;
   (c2) using a measuring process to obtain an apparatus-specific fingerprint of the secondary reference substrate; and
   (c3) subtracting the apparatus-specific fingerprint of the primary reference substrate from the apparatus-specific fingerprint of the secondary reference substrate to obtain and store the apparatus-independent fingerprint of the secondary reference substrate.

3. The method of claim 2, wherein:
   step (c1) comprises:
      (c11) applying a first overlying pattern to the primary reference substrate using either the lithographic apparatus to be calibrated or another lithographic apparatus; and
      (c12) measuring deviations in positioning of the applied first overlying pattern with respect to the primary reference features to obtain the apparatus-specific fingerprint of the primary reference substrate; and
   step (c2) comprises:
      (c21) applying a second overlying pattern to the secondary reference substrate using the same lithographic apparatus as used in step (c1); and
      (c22) measuring deviations in positioning of the applied second overlying pattern with respect to the secondary reference features to obtain the apparatus-specific fingerprint of the secondary reference substrate.

4. The method of claim 3, wherein in step (c12) and (c22) the apparatus-specific fingerprints are measured using measuring apparatus which is separate from the lithographic apparatus used in steps (c11) and (c21).

5. The method of claim 3, wherein the step (d) comprises:
   (d1) removing the second overlying pattern applied in step (c21) without removing the secondary reference features and reapplying the second overlying pattern using the lithographic apparatus being calibrated;
   (d2) measuring deviations in positioning of the reapplied second pattern with respect to the secondary reference features to obtain a fingerprint of the secondary reference substrate which is specific to the apparatus being calibrated; and
   (d3) subtracting the apparatus-independent fingerprint of the secondary reference substrate that was stored in step (c3) from the fingerprint obtained in step (d2) to obtain a substrate-independent fingerprint of the apparatus being calibrated.

6. The method of claim 2, wherein the steps (c1), (c2) and (c3) are repeated with additional secondary reference substrates, to obtain and store an apparatus-independent fingerprint specific to each secondary reference substrate.

7. The method of claim 6, wherein the step (d) is repeated to calibrate a plurality of lithographic apparatuses, each time using at least one of the secondary reference substrates together with its respective apparatus-independent fingerprint in place of the primary reference substrate.

8. The method of claim 6, wherein the step (d) is repeated at a later time to calibrate the same apparatus using a different one of the secondary reference substrates together with its respective apparatus-independent fingerprint.

9. The method of claim 1, wherein the patterning subsystem is arranged to apply a field pattern repeatedly at different field positions across each substrate, and wherein the fingerprints are calculated and applied separately with regard to interfield and intrafield deviations.

10. The method of claim 9, wherein in step (c) an apparatus-independent fingerprint for interfield deviations is stored with data identifying the specific secondary reference substrate, while an apparatus-independent fingerprint of intrafield deviations is stored with data identifying a specific patterning device used in step (c).

11. The method of claim 1, further comprising manufacturing a device using the lithographic apparatus to apply a device pattern to a device substrate after the calibrating of the lithographic apparatus.

12. The method of claim 11, further comprising using the lithographic apparatus is used sequentially to apply different device patterns to the same device substrate, and wherein at least the step (d) is repeated to re-calibrate the lithographic apparatus between applying the different device patterns.

13. The method of claim 1, wherein a plurality of lithographic apparatuses are used sequentially to apply different device patterns to a device substrate after the calibrating of each of the lithographic apparatuses.

14. An apparatus comprising:
a non-transitory computer-readable storage medium; and
at least one processor coupled to the non-transitory computer-readable storage medium and configured to:
(a) providing a primary reference substrate having primary reference features positioned thereon, the positioning of the primary reference features being adopted as an accurate reference for calibration of the lithographic apparatus;
(b) providing a secondary reference substrate having secondary reference features positioned thereon;
(c) obtaining and storing an apparatus-independent fingerprint of the secondary reference substrate relative to the primary reference substrate;
(d) calibrate the lithographic apparatus using the secondary reference substrate and the stored apparatus-independent fingerprint together as a reference; and
(e) use the secondary reference substrate the stored apparatus-independent fingerprint together as the reference to perform subsequent calibrations of the lithographic apparatus,
wherein the apparatus being arranged to receive measurements of the primary reference substrate secondary reference substrate and to calculate and store the apparatus-independent fingerprint of the secondary reference substrate.

15. The data processing apparatus of claim 14, the apparatus being arranged to store at least one apparatus-independent fingerprint corresponding to a specific secondary reference substrate and for step (d) to receive a fingerprint of the secondary reference substrate which is specific to the apparatus being calibrated and to subtract the stored apparatus-independent fingerprint of the secondary reference substrate to obtain a substrate-independent fingerprint of an apparatus being calibrated.

16. An article of manufacture including a non-transitory computer-readable storage medium having instructions stored there on that, in response to execution by a computing device, cause the computing device to perform operations comprising:
(a) providing a primary reference substrate having primary reference features positioned thereon, the positioning of the primary reference features being adopted as an accurate reference for calibration of the lithographic apparatus;
(b) providing a secondary reference substrate having secondary reference features positioned thereon;
(c) obtaining and storing an apparatus-independent fingerprint of the secondary reference substrate relative to the primary reference substrate;
(d) calibrating the lithographic apparatus using the secondary reference substrate and the stored apparatus-independent fingerprint together as a reference; and
(e) using the secondary reference substrate and the stored apparatus-independent fingerprint together as the reference to perform subsequent calibrations of the lithographic apparatus.

* * * * *

UNITED STATES PATENT AND TRADEMARK OFFICE
CERTIFICATE OF CORRECTION

PATENT NO. : 9,177,219 B2
APPLICATION NO. : 13/169673
DATED : November 3, 2015
INVENTOR(S) : Tel et al.

It is certified that error appears in the above-identified patent and that said Letters Patent is hereby corrected as shown below:

IN THE CLAIMS

In column 17, line 48, claim 1, after "lithographic apparatus", please delete ",".
In column 17, line 48, claim 1, after "substrate", please insert --,--.
In column 17, line 51, claim 1, after "substrate", please insert --,--.
In column 17, line 53, claim 1, after "substrate," please delete "the".
In column 17, line 55, claim 1, after "deviations in" please delete "the".
In column 18, line 8, claim 2, after "claim 1", insert --,--.
In column 18, line 10, claim 2, after "fingerprint of", delete "the".
In column 18, line 44, claim 5, after "wherein", delete "the".
In column 18, line 61, claim 6, after "substrate", please delete ",".
In column 19, line 22, claim 12, after "apparatus", please delete "is used".
In column 19, line 24, claim 12, after "least", please delete "the".
In column 19, line 34, claim 14, after "(a)", please delete "providing", and insert --provide--.
In column 19, line 37, claim 14, after "calibration of", please delete "the", and insert --a--.
In column 19, line 39, claim 14, after "(b)", please delete "providing", and insert --provide--.
In column 19, line 41, claim 14, after "(c)", please delete "obtaining and storing", and insert --obtain and store--.
In column 20, line 8, claim 14, after "wherein the", please delete "apparatus" and insert --at least one processor--.
In column 20, line 9, claim 14, after "substrate", please insert --and the--.
In column 20, line 16, claim 15, after "to the", please insert --lithographic--.
In column 20, line 29, claim 16, after "calibration of", please delete "the", and insert --a--.

Signed and Sealed this
Twenty-ninth Day of March, 2016

Michelle K. Lee
*Director of the United States Patent and Trademark Office*